(12) United States Patent
Boudreau, Jr. et al.

(10) Patent No.: US 9,588,149 B2
(45) Date of Patent: Mar. 7, 2017

(54) METHOD AND APPARATUS FOR DETECTING AND COMPENSATING MEASUREMENT ERRORS DUE TO TRANSFORMER SATURATION IN A METER

(71) Applicant: LANDIS+GYR, INC., Lafayette, IN (US)

(72) Inventors: Frank J. Boudreau, Jr., Otterbein, IN (US); Matt E. Kraus, Jamestown, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 0 days.

(21) Appl. No.: 14/792,544

(22) Filed: Jul. 6, 2015

(65) Prior Publication Data

US 2016/0003873 A1   Jan. 7, 2016

Related U.S. Application Data

(60) Provisional application No. 62/020,393, filed on Jul. 3, 2014.

(51) Int. Cl.
*G01R 15/18*   (2006.01)

(52) U.S. Cl.
CPC ........... *G01R 15/183* (2013.01); *G01R 15/18* (2013.01)

(58) Field of Classification Search
CPC .. G01R 15/185; G01R 15/207; G01R 15/202; G01R 15/181; G01R 15/183; G01R 15/186; G01R 19/0092; G01R 33/04; G01R 15/247; G01R 19/14; G01R 19/15; G01R 19/25; G01R 19/252; G01R 19/32;
(Continued)

(56) References Cited

U.S. PATENT DOCUMENTS 3,882,387 A * 5/1975 Vikstrom ............... G01R 19/15
                                                    324/117 R
4,274,051 A * 6/1981 Condon ................. G01R 19/20
                                                    324/117 R
(Continued)

FOREIGN PATENT DOCUMENTS

EP           0447615 A1      9/1991

OTHER PUBLICATIONS

Notification of Transmittal of the International Search Report and the Written Opinion of the International Searching Authority for PCT/US2015/015286, mailed Jun. 19, 2015.

*Primary Examiner* — Vinh Nguyen
(74) *Attorney, Agent, or Firm* — Maginot Moore & Beck LLP

(57) ABSTRACT

A current measurement circuit includes an integrator, first and second transformers, and a current measurement unit. The first transformer includes a first winding about a magnetic core. The magnetic core has an opening through which a current to be measured passes. The first winding is configured to generate a first current based on a first flux in the magnetic core. The second transformer includes second and third windings. The second winding is coupled to receive the first current from the first winding. The second winding has a terminal coupled to the third winding. The third winding is coupled to a first input of the integrator circuit. The output of the integrator circuit is operably coupled to provide an error current to the second transformer. The current measurement unit measures the current through the second winding of the second transformer.

20 Claims, 5 Drawing Sheets

(58) Field of Classification Search
CPC .. G01R 23/10; G01R 31/129; G01R 31/2831; G01R 31/3163; G01R 31/3167; G01R 31/3648; G01R 33/02; G06F 1/3206; G06F 1/324; G06F 1/3296; G06F 1/3203; G06F 11/3058; G06F 11/3409; G06F 15/80; G06F 1/30; G06F 1/3228; G06F 11/0703; G06F 1/3287; G06F 21/558; G06F 2201/865; G06F 2201/885; G06F 9/45558; G01L 3/102; G01L 3/105; H01F 38/30; H01F 38/16; H01F 3/12
See application file for complete search history.

(56) References Cited

U.S. PATENT DOCUMENTS

| | | | | |
|---|---|---|---|---|
| 4,626,777 A | * | 12/1986 | Ainsworth | G01R 19/14 324/117 R |
| 4,899,103 A | * | 2/1990 | Katzenstein | G01R 15/185 324/117 R |
| 5,933,004 A | | 8/1999 | Jackson | |
| 6,121,158 A | | 9/2000 | Benchikha | |
| 6,374,188 B1 | | 4/2002 | Hubbard | |
| 6,414,475 B1 | | 7/2002 | Dames | |
| 6,564,159 B1 | | 5/2003 | Lavoie | |
| 2005/0194962 A1 | | 9/2005 | Briese et al. | |
| 2012/0074927 A1 | | 3/2012 | Ramirez | |

\* cited by examiner

METHOD AND APPARATUS FOR DETECTING AND COMPENSATING MEASUREMENT ERRORS DUE TO TRANSFORMER SATURATION IN A METER

This application claims the benefit of U.S. Provisional Patent Application Ser. No. 62/020,393, filed Jul. 3, 2014, which is incorporated herein by reference.

FIELD OF THE INVENTION

The present invention relates generally to electricity measurements, and more particularly, to current measurements such as those carried out in an electricity meter.

BACKGROUND

One of the goals of electricity metering is to accurately measure the use or consumption of electrical energy resources. With such measurements, the cost of generating and delivering electricity may be allocated among consumers in relatively logical manner. Another goal of electricity metering is help identify electrical energy generation and delivery needs. For example, cumulative electricity consumption measurements for a service area can help determine the appropriate sizing of transformers and other equipment.

Electricity metering often involves the measurement of consumed power or energy in the form of watts or watt-hours. To this end, meters include voltage sensors and current sensors that detect, respectively, the voltage and current delivered to the load. In most cases, the purpose of the voltage sensor is to provide a measurement signal that represents a scaled version of the voltage waveform delivered to the load. Similarly, a current sensor provides a measurement signal that represents a scaled version of the current waveform delivered to the load.

The current measurement in a utility meter can be challenging because a high accuracy is required, and common current sensor technologies can be susceptible to various sources of error. Present metering technologies involve current transformers, or CTs. Existing CT designs are prone to saturation and may distort, causing error especially in a DC magnetic field or when measuring current through a half wave rectified load. Such errors can result in inaccurate measurements, and hence lost revenue.

Moreover, it is known to tamper with meter operation by applying a strong magnet to the meter with the purpose of saturating the CT, thereby resulting in inaccurate measurements. Similarly, it is known to apply half-wave rectification to a load in order to saturate the CT of the meter. Various efforts have been made to thwart such tampering attempts. For example, it is known to provide a metal shield around the CTs of the meter to prevent saturation due to an externally applied permanent magnetic field. However, this adds cost and weight to the meter, and is not effective against other sources of error.

There is a need, therefore, for a current sensor arrangement that favorably improves upon one or more of shortcomings of existing transformers, for example, by providing sufficient accuracy under various circumstances while reducing production cost.

SUMMARY OF THE INVENTION

The invention addresses the above-describe needs, as well as others, by providing a current measurement circuit that detects and in some embodiments measures error induced by saturation and other issues with current transformers used to measure current.

A first embodiment of the invention is a current measurement circuit that includes an integrator, first and second transformers, and a current measurement unit. The integrator circuit has a first input, a second input, and an output. The first transformer includes a first winding about a magnetic core, the magnetic core having an opening through which a conductor having a measurement current passes. The first winding has a first terminal and a second terminal. The first winding is configured to generate a first current based on a first flux in the magnetic core. The second transformer includes second and third windings, each of the second and third windings having a first terminal and a second terminal. The first terminal of the second winding is coupled to receive the first current from the first terminal of the first winding. The second terminal of the second winding is coupled to the second terminal of the third winding. The first terminal of the third winding is coupled to the first input of the integrator circuit. The current measurement unit is operably coupled to measure the current through the second winding of the second transformer. The output of the integrator circuit is operably coupled to provide an error current to the second transformer.

In some embodiments, the error current measurement unit is operably coupled to the output of the integrator circuit and is configured to generate a signal representative of the error current.

The above described features and advantages, as well as others, will become more readily apparent to those of ordinary skill in the art by reference to the following detailed description and accompanying drawings.

DETAILED DESCRIPTION

Figure 1:
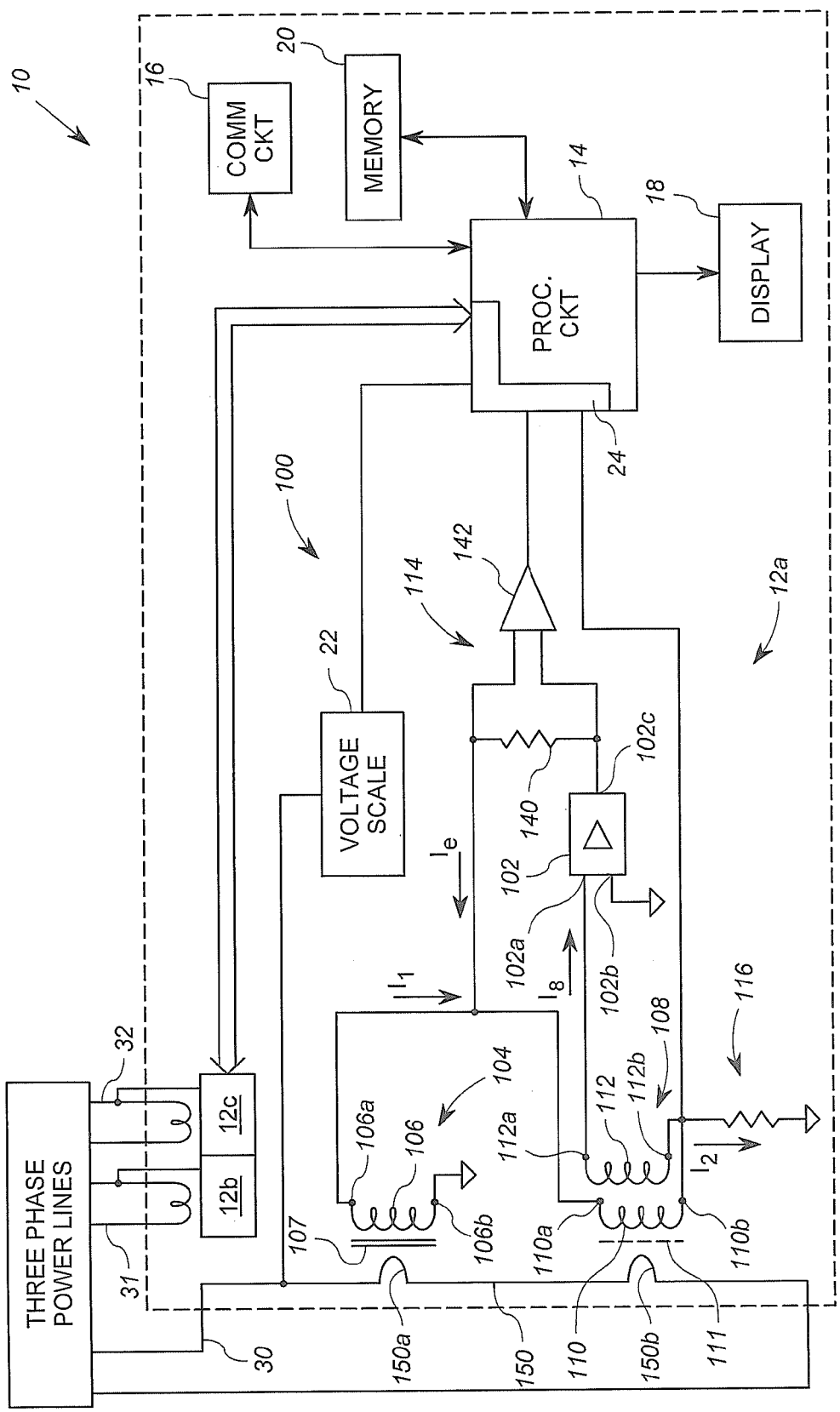
FIG. 1 shows a schematic block diagram of an electricity meter that incorporates at least one current measurement circuit according to the invention.

FIG. 1 shows a schematic block diagram of an electricity meter 10 that incorporates at least one current measurement circuit 100 according to the invention. In this embodiment the meter 10 is a polyphase electricity meter configured to measure energy consumption and related values in a three-phase power system in which an arrangement according the invention is implemented. Referring to FIG. 1 specifically, the meter 10 is an apparatus for measuring energy consumption that includes scaling circuits 12a, 12b and 12c, a processing circuit 14, a communication circuit 16, an optional display 18 a data store/memory 20, and a A/D conversion ("ADC") circuit 24.

Each scaling circuit 12a, 12b, 12c is operably connected to detect voltage and current on one of the phase A, phase B, and phase C power lines 30, 31, 32 providing electricity to a load, not shown. As will be discussed below, the scaling circuit 12a includes a voltage measurement circuit 22 and a current measurement circuit 100. The scaling circuits 12b and 12c in this embodiment have the same structure and operation as the scaling circuit 12a.

In the embodiment described herein, the scaling circuits 12a, 12b, 12c and the A/D conversion circuit 24 are collectively arranged to generate digital signals representative of line voltage waveforms $V_A$, $V_B$, $V_C$ for each of three phases A, B, C of a four-wire electrical system and other digital signals representative of at least three of the line current waveforms $I_A$, $I_B$, $I_C$ of the four-wire electrical system. In some cases, an additional scaling circuit, not shown, cooperates with the ADC circuit 24 to generate a digital signal representative of a neutral line current waveform $I_N$. The meter 10 may also be readily configured for three-wire delta electrical service, as well as other types of electrical service.

The digital measurement signals are typically made up of sequences of digital samples representative of an instantaneous voltage or current measurement on one phase with respect to either neutral or another phase.

The processing circuit 14 is configured to calculate one or more energy consumption values based on the digital signals. The energy consumption values may be communicated to a remote device using the communication circuit 16, displayed using the display 18, stored in the data store/memory 20, or preferably some combination of the foregoing. In accordance with the embodiments described herein, the processing circuit 14 is further operable to perform operations to analyze values representative of error current signals generated by the current measurement circuit 100 to determine possible tampering or other issues.

As mentioned above, the scaling circuit 12a comprises a current measurement circuit 100 and a voltage measurement circuit 22. The voltage measurement circuit 22 may suitably be or include a voltage divider that generates a scaled down version of the voltage waveform present on the phase A power line 30. The current measurement circuit 100 includes circuits and elements that generate a voltage or current signal that represents a scaled down version of the current waveform present on the phase A power line 30.

The ADC circuit 24 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. No. 6,374,188; U.S. Pat. No. 6,564,159; U.S. Pat. No. 6,121,158 and U.S. Pat. No. 5,933,004, all of which are incorporated herein by reference. Moreover, the ADC circuit 24 may readily be a part of an integrated metering chip package, as will be discussed below.

The processing circuit 14 is a device that employs one or more processing devices such as microprocessors, microcontrollers, digital signal processors, discrete digital circuits and/or combinations thereof. As mentioned above, the processing circuit 14 is operable to generate energy consumption data based on the digital signals. In one example, the processing circuit 14 generates watt-hour information based on an accumulation of the products of contemporaneous voltage and current samples. For example, true watt-hours for a particular phase may be calculated as the vector product of the current waveform and the voltage waveform. This vector product may be carried out with sampled voltage $(V_n)$ and sampled current $(I_n)$ by the formula:

$$\text{Whrs} = \Sigma V_n * I_n. \tag{3}$$

where Whrs is an accumulated energy value (i.e. watt-hours) for a time frame from a starting time $n_0$ to a time corresponding to n.

Various processing circuits operable to generate energy consumption data from digital voltage and digital current measurement signals are well known in the art. Suitable examples of such circuits are described in U.S. Pat. No. 6,374,188; U.S. Pat. No. 6,564,159; U.S. Pat. No. 6,121,158 and U.S. Pat. No. 5,933,004. However, in one preferred embodiment, the processing circuit is (or includes) a processing element of a metering integrated circuit chip such as the Teridian 71M6533 measurement chip (available from Maxim). In that embodiment, both the ADC circuit 24 and the processing circuit 14 are disposed within the same semiconductor package.

The processing circuit 14 is further operable to store the plurality of energy consumption values in the memory 20. In some embodiments, the processing circuit 14 may store energy consumption values for each of plurality of time periods, in order to allow analysis of energy usage at different times of day, days of the week or month, or even seasonally. The storage of consumption indexed to time periods is often referred to in the industry as "load profiling". The memory 20 may suitably be a random access memory, EEPROM, other memory, or a set of several types of memory. In still other embodiments, the memory 20 may include a circular buffer, FIFO device, or other memory that stores data in the order in which it is received. Other known methods may be used. In at least some embodiments, the memory 20 includes memory located within the integrated package that houses the processing circuit 14. The memory 20 also includes one or more software programs that are executed by the processing circuit 14 to perform the operations of the processing circuit 14 described herein.

The communication circuit 16 is a device that is in some embodiments configured to communicate data between the meter 10 and one or more remote devices. In a system such as that shown in FIG. 1, the communication circuit 16 would be operable to communicate directly or indirectly with a data collection system of a utility service provider. Several of such systems are known. The utility service provider then uses the collected data to generate billing information and/or data forecasting information as is known in the art. To this end, the communication circuit 16 may suitably include a radio, a telephone modem, a power line carrier modem, or other known communication device configured for use with utility meters. Radios may be used that operate in the 100 MHz to 1 GHz range. However, other devices may operate in the kHz or low MHZ range.

In addition or in the alternative, the communication circuit 16 may be configured to communicate with a locally coupled device, such as a reed switch, portable computing device, or other device. The communication circuit 16 may include an optical or electrical data port, not shown, for this purpose.

The meter display 18, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

In accordance with embodiments of the invention the current measurement circuit 100 measures the phase A power line current in a manner that also measures, and compensates for, errors due to saturation and/or other distortion in the traditional current transformer-based current measurement circuit. In particular, current measurement circuit 100 includes a magnetic core current transformer 104 for the purpose of measuring current on the phase A power line 30. As is known in the art, a typical current transformer (CT) such as the CT 104 is susceptible to distortion and inaccuracy due the presence of strong DC magnetic fields, half-wave rectified loads, and/or excessive load current. The current measurement circuit 100 includes features that compensate for errors due to saturation within the CT 104, and also provides a method from which saturation/measurement errors of the CT 104 can be quantified. The processing circuit 14 cooperates with the measurement circuit 100 to detect saturation events related to the CT 104, which can include those associated with tampering.

As shown in FIG. 1, the current measurement circuit 100 includes an integrator circuit 102, a first transformer 104, a second transformer 108, an error current measurement unit 114, and a current measurement unit 116.

The first transformer 104 is a current transformer having a magnetic core 107 and at least a first winding 106 wound about the core 107. The core 107 is preferably in the shape of a ring having an open center through which a conductor carrying the phase A power line signal may pass. In this embodiment, the first transformer 104 as described herein is a toroidal current transformer that does not actually contain a "primary winding". Instead, the primary winding is part of a conductor 150 that carries the phase A power line signal within the meter 100. This conductor 150 is known as the current coil 150. The current coil 150 forms the single turn "primary" winding 150a for the first transformer 104, while the winding 106 is an N-turn "secondary" winding of the first transformer 104. The first winding 106 has a first terminal 106a and a second terminal 106b. The first transformer 104 is configured to generate a first current $I_1$ in the first winding 106 based on a first flux in the magnetic core 107 generated via the current flowing through the current coil 150.

The second transformer 108 is preferably a DI/DT transformer having a non-magnetic core 111, and includes a DI/DT winding 110 and a sense winding 112. Each of the windings 110, 112 have a first terminal 110a, 112a and a second terminal 110b, 112b. Each of the windings 110, 112 preferably has the same number of turns N as the first winding 106 of the transformer 106, but in any event have the same number of turns as each other. The first terminal 110a of the DI/DT winding 110 is operably coupled to receive the first current $I_1$ from the first terminal 106a of the first winding 106. The second terminal 110b of the second winding 110 coupled to the second terminal 112b of the sense winding 112, and the first terminal 112a of the sense winding 112 is coupled to the first input 102a of the integrator circuit 102.

Figure 2:
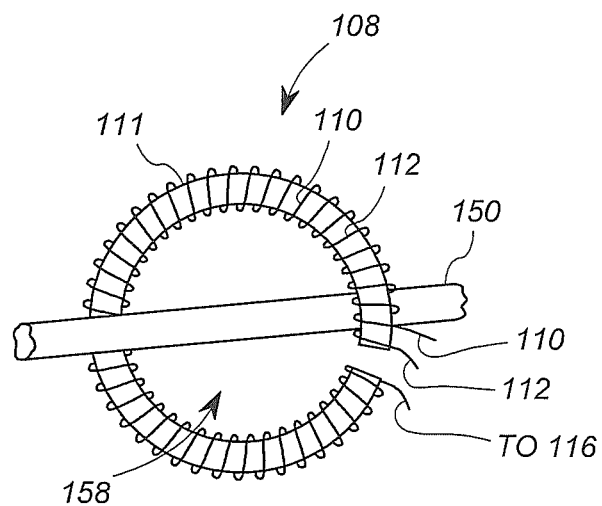
FIG. 2 shows a representative schematic diagram of a second or DI/DT transformer that may be used in the electricity meter of FIG. 1.

The second (or DI/DT) transformer 108 may suitably take the form of a Rogowski coil as shown in FIG. 2. As with the first (or current) transformer 104, the DI/DT transformer 108 does not include a traditional "primary" winding, but rather employs another part 150b of the current coil 150 as a single turn primary winding. A shown in FIG. 2, the DI/DT transformer 108 is arranged about the meter current coil 150. As discussed above, the meter current coil 150 is a conductive bar or other conductive element that carries the load current of the power line 30. The DI/DT transformer 108 includes a non-magnetic core 111 around which is wrapped the bifilar windings 110, 112. The core 111 may take any suitable form but preferably has a central opening 158 through which the current coil 150 passes, such that the windings 110, 112 substantially surround the current coil 150. It will be appreciated that the geometry of the current coil 150 and the DI/DT transformer 108 may take other suitable physical forms for current sensing purposes.

Referring again to FIG. 2, the integrator 102 is preferably an op-amp based integrator, and may suitably include a current buffer. Further detail regarding a suitable integrator 102 is provided below in connection with FIG. 5. The second input 102b of the integrator is coupled to ground, and the output 102c is coupled to the error current measurement unit 114. The integrator 102 is configured to generate an output signal $I_e$ that is an integrated version of the signal at the first input. The output 102c of the integrator 102 forms an error current signal $I_e$ that is representative of the saturation or other error in the current transformer 104, as will be discussed below.

The error current measurement unit 114 in this embodiment is a sense resistor 140 and a differential amplifier 142. The sense resistor 140 is preferably of very low relative resistance, e.g. 10 ohms, and is operably coupled between the output 102c of the integrator 102 and the first terminal 110a of the DI/DT transformer 108. The two inputs of the differential amplifier 142 are coupled across the two inputs terminals of the sense resistor 140. The output of the differential amplifier 142 is operably connected to provide a voltage signal $V_{Ie}$ representative of the error current $I_e$ to the processing circuit 14 (via the ADC circuit 24).

The current measurement unit 116 in this embodiment is a relatively low resistance resistor coupled between the second terminals 110b, 112b of the windings 110, 112 and ground. The current measurement unit or resistor 116 is operably coupled to provide a voltage representative of the measurement current through the windings 110, 112 to the processing circuit 14 (via the ADC circuit 24). As will be discussed below, the current through the resistor 116 is representative of the current on the power line 30.

The scaling circuits 12b and 12c may suitably have the same structure as the scaling circuit 12a.

In basic operation, electrical power flows through the phase A, phase B and phase C power lines 30, 31, 32 to deliver energy to a customer load, not shown. The phase A scaling circuit 12a generates voltage and current measurement signals representative of, respectively, the voltage and current waveforms on the phase A power line 30. The scaling circuits 12b and 12c similarly generate corresponding voltage and current measurement signals representative of, respectively, the voltage and current waveforms on their respective power lines 31, 32. The scaling circuits 12a, 12b and 12c provide these measurement signals to the processing circuit 14 via the ADC circuit 24. The ADC circuit 24 digitizes the measurements signals to generate digital or sampled waveforms. The processing circuit 14 performs various calculations on the digital measurement signals to generate various metering quantities.

The operation of the current measurement circuit 100 of the scaling circuit 12a is described below in further detail. It will be appreciated that similar current measurement circuits of the scaling circuits 12b and 12c operate in the same way. In general, current measurement is carried out by the current transformer 104. However, the current transformer 104 is susceptible to error due to saturation of its magnetic core 107. By contrast, the DI/DT transformer 108 has a non-magnetic core 111, and is therefore not susceptible to saturation errors. Accordingly, the DI/DT transformer 108 is used in connection with the integrator 102 to generate an error current $I_e$ that represents the difference between the current sensed by the current transformer 104 and that sensed by the DI/DT transformer 108. The error current $I_e$ is measured and then fed back to the measured current to compensate the measured current for the error. The compensated current may then be used in energy calculations, thereby negating errors due to saturation. In addition, the processing circuit 14 may also obtain and analyze the error current $I_e$ to determine if there is potential tampering or malfunction in meter.

In particular, as current $I_A$ flows on the phase A power line 30 to the load, the current transformer 104 operates via the magnetic flux in the core 107 to generate a secondary current $I_1$ in the first winding 106. The secondary current $I_1$ is then provided to the DI/DT winding 110 of the DI/DT transformer 108. The DI/DT transformer 108 also senses the current $I_A$ and has a flux created via the flow of the current $I_A$. Ideally, the flux generated by the DI/DT winding and the flux generated in the current transformer 104.

In actual operation, however, the sense winding 112 develops an error voltage $V_\delta$ based on the flux imbalance arising from any differences in the measurements of the current $I_A$ in the winding 106 and the measurements of the current $I_A$ in the winding 110. The integrator 102 receives and integrates the voltage $V_\delta$ to create an error current signal $I_e$. The integrator output 102c feeds the error current signal $I_e$ back to the DI/DT winding 110.

The feedback current signal $I_e$ operates to drive the error voltage $V_\delta$ at the integrator input 102a to zero. The error voltage $V_\delta$ drives to zero when the error current $I_e$ is equal to the difference between the current measured on the winding 106 and the current measured on the winding 110. The compensated current $I_1+I_e$ is then provided to the current measurement resistor 116, which is the provided to the processing circuit 14 (via that ADC circuit 24) for use as the current measurement signal for the phase A power line.

The voltage sense circuit 22 contemporaneously generates a voltage measurement signal having a waveform that represents a scaled down version of the voltage on the phase A power line 30. The voltage sense circuit 22 provides the voltage measurement signal to the processing circuit 14 via the ADC circuit 24.

In a similar manner, the scaling circuits 12b and 12c provide voltage and current measurement signals representative of the phase B and phase C voltage and current to the processing circuit 14 via the ADC circuit 24. Preferably, the scaling circuits 12b and 12c provide current measurement signals that are compensated in a manner similar to that carried out by the current measurement circuit 100. The processing circuit 14 may then generate metering quantities, such as energy consumption (kwh), based on the voltage measurement signal and the compensated current measurement signals from all three scaling circuits 12a, 12b, 12c.

In addition to measurement compensation, the current measurement circuit 100 also provides a measure of the saturation-related error in the current transformer 104 via the error current measurement circuit 114. To this end, the error current $I_e$ flows through the sense resistor 140 as it is fed back to the winding 110. As a consequence, a voltage $V_{Ie}$ representative of the error current $I_e$ is developed over the sense resistor 140. The differential amplifier 142 amplifies the voltage $V_{Ie}$ and provides the result to the processing circuit 14 via the ADC circuit 24. The ADC circuit 24 provides the processing circuit 14 with a digital value ERR that is representative of the error current.

The processing circuit 14 may then further process the digital value ERR to determine whether a tamper event or some other event relating to the saturation of the current transformer 104 should be recorded, reported, and/or displayed. As discussed above, the error current $I_e$ and hence ERR is often due to saturation of the current transformer 104. A persistent condition of saturation of the current transformer 104 (or other error) can indicate a condition that requires correction. For example, saturation of the current transformer 104 can result from too much current being drawn through the power line 30, or from intentional tampering with the meter. In either case, corrective action is indicated. Accordingly, the processing circuit 14 further processes the digital value ERR to determine whether the error in the operation of the current transformer 104 requires corrective action.

Figure 3:
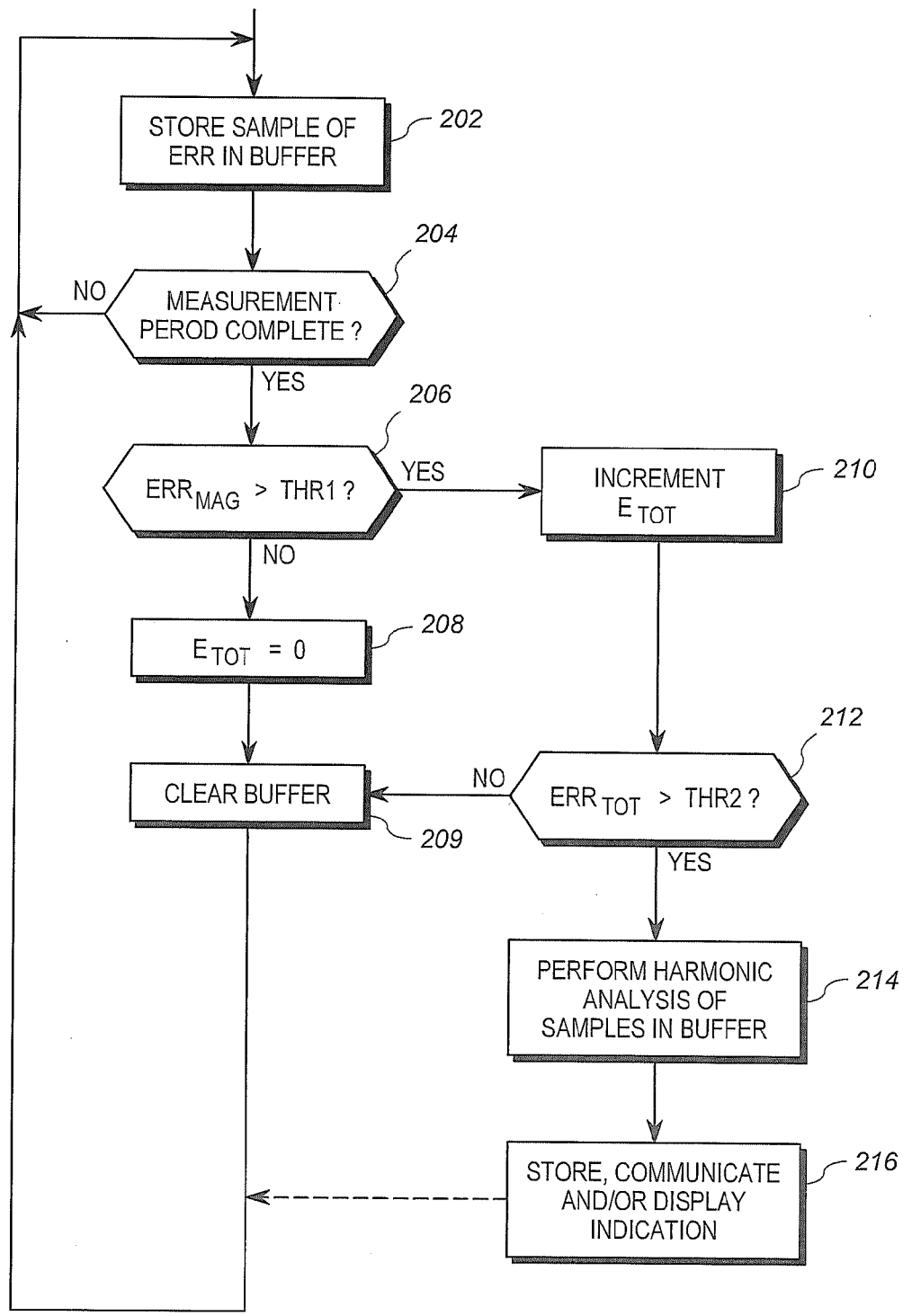
FIG. 3 shows a set of operations performed by a processing circuit to analyze the error current generated by the current measurement circuit of the meter of FIG. 1.

FIG. 3 shows an exemplary set of operations that may be performed by the processing circuit 14 to further process the value ERR that is representative of the error current $I_e$. It will be appreciated that the operations of FIG. 3 only relate to the processing of the error signal ERR, and not to the conventional operations of the processing circuit 14 to generate metering values, and to perform other tasks.

In general, the processing circuit 14 in step 202 receives and stores the samples of ERR in a buffer, for example, a circular buffer, in the memory 20. Thus, on an ongoing basis, the buffer contains a series of samples of ERR that represent the waveform of the error current $I_e$. The processing circuit 14 then determines whether a measurement period is complete in step 204. In particular, the remaining operations of FIG. 3 preferably occur after a predetermined measurement period, for example, once per second, to limit the processing load of the processing circuit 14.

If the current measurement period is complete, then the processing circuit 14 proceeds to step 206. Otherwise, the processing circuit 14 returns to step 202 to store the next sample of ERR.

In step 206, the processing circuit 14 determines whether the magnitude of ERR exceeds a predetermined threshold $THR_1$. To this end, the processing circuit 14 may suitably calculate the RMS value of ERR using the samples of ERR in the buffer, or at least the last M cycles of the ERR in the buffer corresponding to the last several cycles of the 60 Hz power line signal. The RMS value of ERR represents the magnitude of the error current $I_e$, and hence the magnitude of the error in the current transformer 104. The value of $THR_1$ should be chosen such that minor errors in the operation of the transformer 104 are below the threshold.

If the processing circuit 14 in step 206 determines that the magnitude of ERR exceeds $THR_1$, then the processing circuit 14 proceeds to step 210. If not, then the processing circuit 14 proceeds instead to step 208, discussed further below. In step 210, the processing circuit 14 increments a value $E_{TOT}$. The value $E_{TOT}$ represents the number of consecutive measurement periods in which the magnitude of ERR has exceeded $THR_1$. In this embodiment, the processing circuit 14 only records, stores and/or displays an error if the error current magnitude exceeds a threshold for more than a predetermined amount of time. This prevents false alarms caused by temporary measurement anomalies or spurious events. Accordingly, the purpose of $E_{TOT}$ is to track the time over which the magnitude of ERR exceeds the threshold $THR_1$.

After step 210 the processing circuit 14 executes step 212. In step 212, the processing circuit 14 determines whether the value $E_{TOT}$ exceeds another threshold value $THR_2$. The threshold value $THR_2$ should be selected to correspond to a time period over which a non-trivial error signal indicates possible tampering, or a malfunctioning or undersized current transformer 104. The threshold value $THR_2$ may suitably correspond to several minutes or longer.

If the processing circuit 14 determines in step 212 that $E_{TOT}$ does not exceed $THR_2$, then the processing circuit 14 proceeds to step 209, discussed further below. If, however, the processing circuit 14 determines in step 212 that $E_{TOT}$ exceeds $THR_2$, then the processing circuit 14 proceeds to step 214.

In step 214, the processing circuit 14 performs analysis of the samples of ERR in the buffer to determine a potential source of the transformer error. As discussed above, the buffer includes samples representative of the waveform of the current error signal $I_e$. In one embodiment, the processing circuit 14 performs harmonic analysis on the current error signal $I_e$ using the stored samples of ERR. It has been determined that if the error signal $I_e$ contains a greater magnitude of even harmonics (with respect to the 60 Hz power line frequency), then the error is likely due to magnetic saturation of the current transformer core 107, or a half-wave rectified load (connected to the phase A power line 30). Both of these conditions are indicative of tampering. If, however, the error signal $I_e$ contains a greater magnitude of odd harmonics (with respect to the 60 Hz power line frequency), then the error is likely due to overcurrent and/or degradation of the transformer 104. Neither of these conditions are necessarily indicative of tampering, but nevertheless can require corrective action. After step 214, the processing circuit 14 proceeds to step 216.

In step 216, the processing circuit 14 stores in the memory 20, communicates via the communication circuit 16, and/or displays on the display 18, an appropriate indication based on the harmonic analysis of step 214. Thus, for example, the processing circuit 14 may suitably display, store or communicate an indication of possible tampering or possible overloading of the transformer based on which harmonics are dominant. The processing circuit 14 may also use an indication of an error of indeterminate origin when neither even or odd harmonics are clearly dominant. Once the processing circuit 14 stores, flags or communicates an error, it may discontinue or continue the operations of FIG. 3.

Referring back to step 206, if the magnitude of ERR does not exceed the value $THR_1$, then the processing circuit 14 proceeds to step 208. In step 208, the processing circuit 14 clears the value of $E_{TOT}$. Thereafter, in step 209, the processing circuit 14 clears the buffer. The processing circuit 14 then returns to step 202.

Accordingly, the current measurement circuit 100 and the processing circuit 14 cooperate to form an arrangement for detection and analysis of errors in a current transformer 104 of an electricity meter. It will be appreciated that the analysis may suitably be carried out in other ways. For example, in some embodiments, the analysis of step 214 is not performed. Thus, the processing circuit 14 would store, communicate or display the existence of a generic error if the magnitude of the current error signal $I_e$ exceeds the threshold $THR_1$ for more than the predetermined time period defined by $THR_2$.

Figure 4:
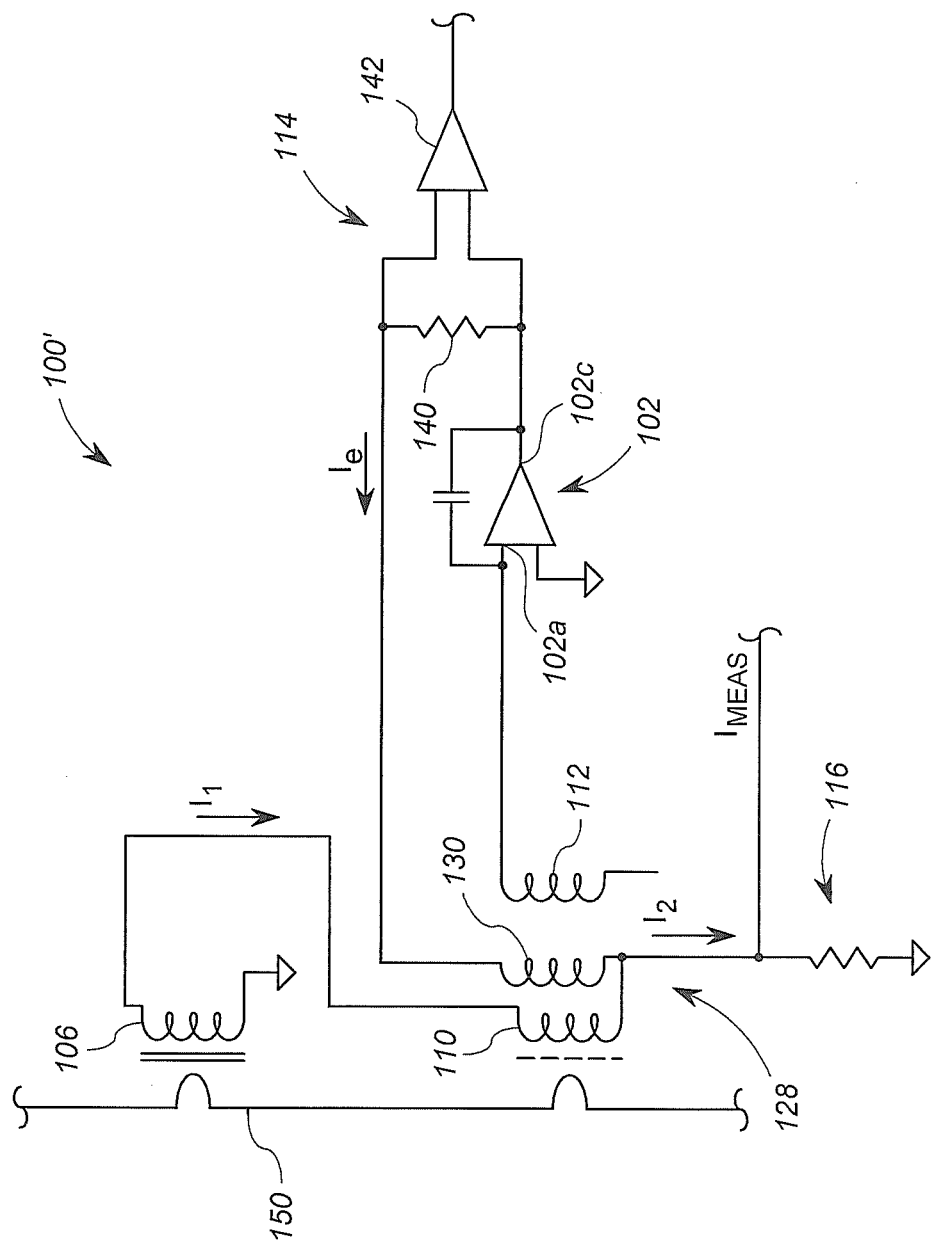
FIG. 4 shows a schematic block diagram of an alternative exemplary current measurement circuit that may be used in the meter of FIG. 1.

FIG. 4 shows an alternative exemplary current measurement circuit 100' that may be used in the meter 10 of FIG. 1. FIG. 4 shows the exemplary current measurement circuit 100' apart from the remainder of the meter 10. However, it will be appreciated that the measurement circuit 100' would be connected in the same manner as the measurement circuit 100 of FIG. 1.

The current measurement circuit 100' is largely identical to the current measurement circuit 100 of FIG. 1, except that the DI/DT transformer 108 has been replaced with a three winding DI/DT transformer 128. The DI/DT transformer 128 includes a DI/DT winding 110 and a sense winding 112 identical to the corresponding DI/DT winding 110 and sense winding 112 of the transformer 108 of FIG. 1. However, the DI/DT transformer 128 includes a third winding 130. A first terminal of the third winding 130 is operably coupled to receive the error current signal $I_e$ from output 102c of the integrator 102 (via the sense resistor 140). A second terminal of the third winding 130 is coupled to the second terminal 110b of the DI/DT winding 110.

The error current $I_e$ is developed in the same way as described above in connection with FIG. 1. In the embodiment of FIG. 4, however the third winding 130 provides the path for the error current $I_e$ to be added to (and compensate) the erroneous current $I_1$ for measurement by the current measurement unit 116. In addition, third winding 130 provides a path for the error current $I_e$ to provide the flux to drive the voltage on the sense winding 112 to zero. The current measurement circuit 100' of FIG. 4 otherwise operates in the same manner as the current measurement circuit 100 of FIG. 1.

Figure 5:
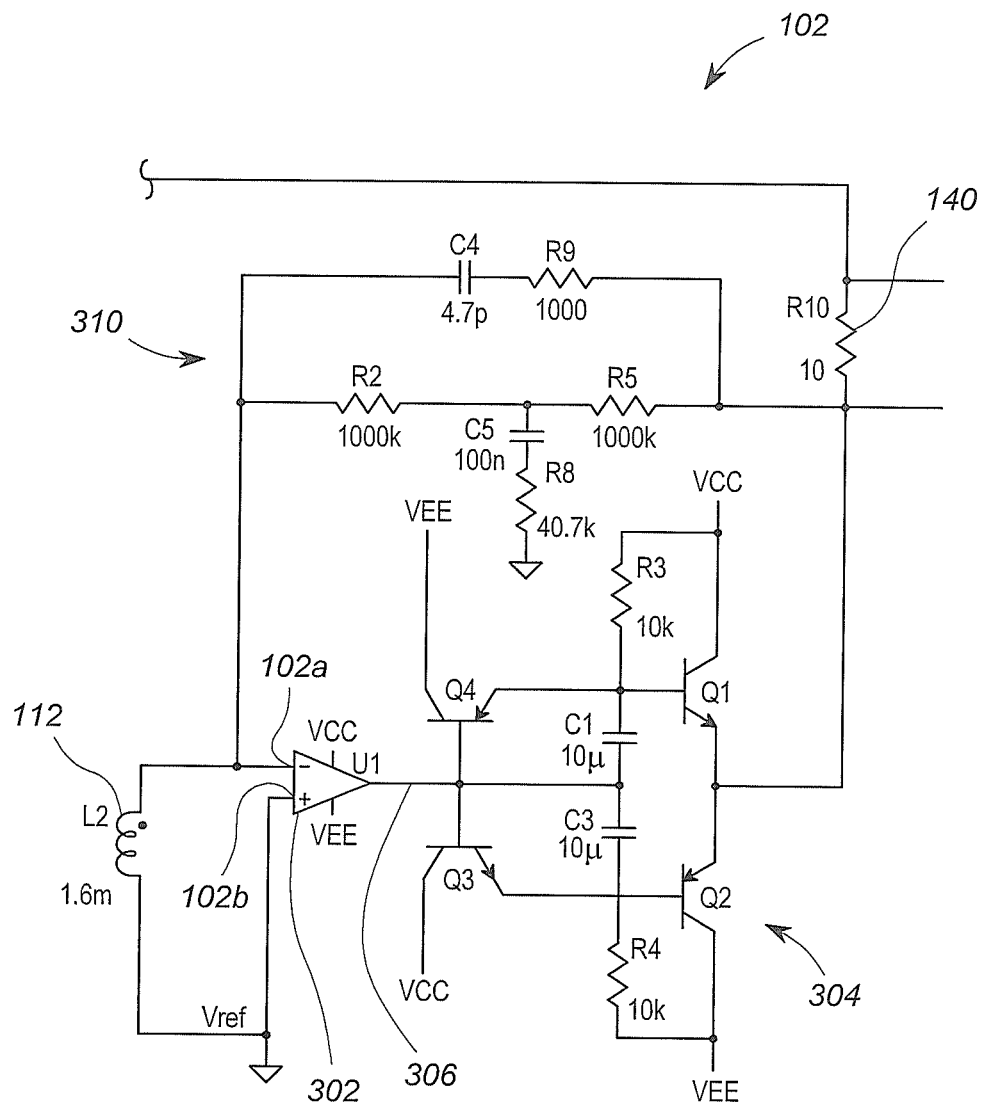
FIG. 5 shows a schematic block diagram of an exemplary embodiment of an integrator that may be used in the current measurement circuit of the meter of FIG. 1.

FIG. 5 shows in further detail a schematic diagram of an exemplary implementation of the integrator 102 of FIGS. 1 and 4. FIG. 5 shows the integrator 102 apart from the remainder of the current measurement circuits 100, 100', apart from the sense winding 112 and sense resistor 140 which are provided for context.

The integrator 102 includes a low voltage instrumentation amplifier 302 having differential inputs forming the inputs 102a, 102b of the integrator. The integrator 102 also includes a current buffer 304 having an input 306 coupled to the output of the instrumentation amplifier 302, and an output 308 coupled to the integrating feedback path 310. The current buffer 304 is provided to allow for the use of an accurate, low voltage differential amplifier 302 in the integrator 102 while achieving the necessary levels of the current $I_e$ to achieve compensation of the measurement current $I_1$.

The current buffer 304 includes a PNP transistor Q4 and an NPN transistor Q3 having respective bases connected to the input 306. The collectors of the transistors Q3 and Q4 are coupled, respectively, to high and low bias voltages VEE and VCC of the circuit. The current buffer 304 further includes a first capacitor C1 coupled between the emitter of the transistor Q4 and the input 306, and a capacitor C3 coupled between the emitter of the transistor Q3 and the input 306. The current buffer 304 also includes a PNP transistor Q2 and an NPN transistor Q1 having respective emitters connected to the output 308. The collectors of the transistors Q3 and Q4 are coupled, respectively, to high and low bias voltages VEE and VCC of the circuit. The base of the transistor Q1 is coupled to the emitter of the transistor Q4, and the base of the transistor Q2 is coupled to the emitter of the transistor Q3. A resistor R3 is coupled between the collector and base of the transistor Q1, and a resistor R4 is coupled between the collector and base of the transistor Q2. It will be appreciated, however, that the current buffer 304 may take other forms.

The integrating feedback path 310 provides the integrating function of the integrator 302. The feedback path 310 includes a 1000 ohm resistor R9 and 4.7 pf capacitor C4 series-connected between the output 308 and the input 102a. It will be appreciated that the time constant of the integrator 102 may be adjusted by changing the values of either or both of the resistor R9 and/or the capacitor C4.

The present invention thus provides a low cost way that both compensates for a saturated core in a current transformer of an electricity meter, and also measures and even analyzes the error.

It will be appreciated that the above-described embodiments are merely illustrative, and that those of ordinary skill in the art may readily devise their own implementation and modifications that incorporate the principles of the present invention and fall within the spirit and scope thereof.

What is claimed is:

1. A current measurement circuit comprising:
an integrator circuit having a first input, and an output;
a first transformer including a first winding about a magnetic core, the magnetic core including an opening through which a conductor carrying measurement current passes, the first winding having a first terminal and a second terminal, the first winding configured to generate a first current based on a first flux in the magnetic core;
a second transformer including second and third windings, each of the second and third windings having a first terminal and a second terminal, the first terminal of the second winding coupled to receive the first current from the first terminal of the first winding, the second terminal of the second winding coupled to the second terminal of the third winding, the first terminal of the third winding coupled to the first input of the integrator circuit; and
a current measurement unit operably coupled to measure the current through the second winding of the second transformer;
wherein the output of the integrator circuit is operably coupled to provide an error current to the second transformer.

2. The current measurement circuit of claim 1, further comprising an error current measurement unit operably coupled to the output of the integrator circuit and to the first terminal of the second winding of the second transformer, the error current measurement unit configured to generate a signal representative of the error current.

3. The current measurement circuit of claim 1, wherein the integrator circuit includes an operational amplifier and a current buffer operably coupled to an output of the operational amplifier.

4. The current measurement circuit of claim 1, wherein the second transformer includes a non-magnetic core.

5. The current measurement circuit of claim 4, wherein the second winding and third winding are bifilar windings about the non-magnetic core.

6. The current measurement circuit of claim 5, wherein the non-magnetic core extends around the conductor.

7. The current measurement circuit of claim 2, further comprising a processing circuit operably coupled to the error current measurement unit, the processing circuit configured to:
determine whether the error current exceeds a first threshold; and
store an indication of a tamper event if the error current exceeds the first threshold for a period of time.

8. A circuit arrangement in a utility meter, comprising:
a voltage measurement circuit configured to generate a voltage measurement signal;
a current measurement circuit comprising an integrator circuit, a first transformer, and a second transformer, the integrator circuit having a first input and an output, the first transformer including a first winding about a magnetic core, the magnetic core including an opening through which a conductor carrying measurement current passes, the first winding having a first terminal and a second terminal, the first winding configured to generate a first current based on a first flux in the magnetic core, the second transformer including second and third windings, each of the second and third windings having a first terminal and a second terminal, the first terminal of the second winding coupled to receive the first current from the first terminal of the first winding, the second terminal of the second winding coupled to the second terminal of the third winding, the first terminal of the third winding coupled to the first input of the integrator circuit; and
a current measurement unit operably coupled to generate a current measurement signal by measuring the current through the second winding of the second transformer;
an analog-to-digital conversion (A/D) circuit operably coupled to receive the voltage measurement signal and the current measurement signal and generate digital voltage and current measurement signals therefrom;
a processing circuit configured to generate energy consumption information based at least in part on the digital voltage and current measurement signals.

9. The circuit arrangement of claim 8, further comprising an error current measurement unit operably coupled to the output of the integrator circuit and to the first terminal of the second winding of the second transformer, the error current measurement unit configured to generate a signal representative of the error current.

10. The circuit arrangement of claim 9, wherein the processing circuit operably coupled to receive information representative of the signal representative of the error current is further configured to:
determine whether the error current exceeds a first threshold based on the information; and
store an indication of an event in a memory if the error current exceeds the first threshold for a period of time.

11. The circuit arrangement of claim 10, wherein the error current measurement unit includes a sense resistor coupled across differential inputs of an operational amplifier.

12. The circuit arrangement of claim 11, wherein an output of the operational amplifier is operably coupled to the processing circuit.

13. The circuit arrangement of claim 8, wherein the second transformer includes a non-magnetic core.

14. The circuit arrangement of claim 13, wherein the second winding and third winding are bifilar windings about the non-magnetic core.

15. The circuit arrangement of claim 14, wherein the non-magnetic core extends around the conductor.

16. A current measurement circuit comprising:
an integrator circuit having a first input and an output;
a first transformer including a first winding about a magnetic core, the magnetic core including an opening through which a conductor carrying measurement current passes, the first winding having a first terminal and a second terminal, the first winding configured to generate a first current based on a first flux in the magnetic core;
a second transformer having a non-magnetic core that extends around the conductor, and including second and third windings, each of the second and third windings having a first terminal and a second terminal, the first terminal of the second winding coupled to receive the first current from the first terminal of the first winding, the second terminal of the second winding coupled to the second terminal of the third winding, the first terminal of the third winding coupled to the first input of the integrator circuit; and a current measurement unit operably coupled to measure the current through the second winding of the second transformer;

wherein the output of the integrator circuit is operably coupled to provide an error current to the second transformer.

17. The current measurement circuit of claim 16, further comprising an error current measurement unit operably coupled to the output of the integrator circuit and to the first terminal of the second winding of the second transformer, the error current measurement unit configured to generate a signal representative of the error current.

18. The current measurement circuit of claim 17, further comprising a processing circuit operably coupled to the error current measurement unit, the processing circuit configured to:

determine whether the error current exceeds a first threshold; and store an indication of a tamper event if the error current exceeds the first threshold for a period of time.

19. The current measurement circuit of claim 16, wherein the integrator circuit includes an operational amplifier and a current buffer operably coupled to an output of the operational amplifier.

20. The current measurement circuit of claim 1, further comprising an error current measurement unit operably coupled to the output of the integrator circuit and to a first terminal of a fourth winding of the second transformer, the fourth winding having a second terminal coupled to the second terminal of the second winding of the second transformer, the error current measurement unit configured to generate a signal representative of the error current.

* * * * *